(12) United States Patent
Kimoto et al.

(10) Patent No.: US 12,396,230 B2
(45) Date of Patent: Aug. 19, 2025

(54) SiC SEMICONDUCTOR DEVICE MANUFACTURING METHOD AND SiC SEMICONDUCTOR DEVICE

(71) Applicant: KYOTO UNIVERSITY, Kyoto (JP)

(72) Inventors: Tsunenobu Kimoto, Kyoto (JP); Takuma Kobayashi, Kyoto (JP); Keita Tachiki, Kyoto (JP)

(73) Assignee: KYOTO UNIVERSITY, Kyoto (JP)

( * ) Notice: Subject to any disclaimer, the term of this patent is extended or adjusted under 35 U.S.C. 154(b) by 461 days.

(21) Appl. No.: 18/007,985

(22) PCT Filed: May 27, 2021

(86) PCT No.: PCT/JP2021/020202
§ 371 (c)(1),
(2) Date: Dec. 2, 2022

(87) PCT Pub. No.: WO2021/246280
PCT Pub. Date: Dec. 9, 2021

(65) Prior Publication Data
US 2023/0307503 A1    Sep. 28, 2023

(30) Foreign Application Priority Data
Jun. 5, 2020  (JP) .................. 2020-098244

(51) Int. Cl.
*H10D 62/832* (2025.01)
*H10D 12/01* (2025.01)
(52) U.S. Cl.
CPC ....... *H10D 62/8325* (2025.01); *H10D 12/031* (2025.01)

(58) Field of Classification Search
None
See application file for complete search history.

(56) References Cited

U.S. PATENT DOCUMENTS

| 2007/0015333 A1 | 1/2007 | Kishimoto et al. |
| 2012/0241767 A1 | 9/2012 | Yano et al. |

(Continued)

FOREIGN PATENT DOCUMENTS

| JP | 11-67757 A | 3/1999 |
| JP | 2016-58658 A | 4/2016 |

(Continued)

OTHER PUBLICATIONS

Chung et al., "Improved Inversion Channel Mobility for 4H-SiC MOSFETs Following High Temperature Anneals in Nitric Oxide", IEEE Electron Device Letters, Apr. 2001, vol. 22, No. 4, pp. 176-178.

(Continued)

*Primary Examiner* — Jack S Chen
(74) *Attorney, Agent, or Firm* — Birch, Stewart, Kolasch & Birch, LLP

(57) ABSTRACT

A SiC semiconductor device manufacturing method includes a step of etching a surface of a SiC substrate 1 with $H_2$ gas at a temperature of 1200° C. or more, a step of forming a $SiO_2$ film 3, 4 on the SiC substrate under conditions where the SiC substrate is not oxidized, and a step of thermally treating the SiC substrate formed with the $SiO_2$ film in $N_2$ gas atmosphere at a temperature of 1350° C. or more.

10 Claims, 13 Drawing Sheets

(56) References Cited

U.S. PATENT DOCUMENTS

2016/0126092 A1    5/2016  Makifuchi et al.
2023/0307503 A1*   9/2023  Kimoto ............. H01L 21/02315

FOREIGN PATENT DOCUMENTS

WO    WO 2011/074237 A1    6/2011
WO    WO 2015/005397 A1    1/2015

OTHER PUBLICATIONS

Devynck et al., "Charge transition levels of carbon-, oxygen-, and hydrogen-related defects at the SiC/SiO$_2$ interface through hybrid functionals", Physical Review B 84, 2011, pp. 235320-1 to 235320-18.

Kawahara et al., "Deep levels generated by thermal oxidation in p-type 4H-SiC", Journal of Applied Physics, 2013, vol. 113, pp. 033705-1 to 033705-9.

Kawahara et al., "Deep Levels Generated by Thermal Oxidation in n-Type 4H-SiC", Applied Physics Express 6, 2013, pp. 051301-1 to 051301-4.

Kobayashi et al., "Design and formation of SiC (0001)/SiO$_2$ interfaces via Si deposition followed by low-temperature oxidation and high-temperature nitridation", Applied Physics Express, Aug. 14, 2020, vol. 13, pp. 091003-1 to 091003-4.

\* cited by examiner

SiC SEMICONDUCTOR DEVICE MANUFACTURING METHOD AND SiC SEMICONDUCTOR DEVICE

TECHNICAL FIELD

The present invention relates to a silicon carbide (SiC) semiconductor device manufacturing method and a SiC semiconductor device.

BACKGROUND ART

In a case where a $SiO_2$ film (a gate oxide film) is formed on a surface of a SiC substrate by thermal oxidation in a MOS transistor (SiC MOSFET) using the SiC substrate, there is a problem that a defect density at an interface between the $SiO_2$ film and the SiC substrate is extremely high. With a high interface defect density, the characteristics of the SiC MOSFET, such as channel mobility, cannot be sufficiently obtained.

As a method for reducing the interface defect density, Patent Document 1 discloses a method in which instead of directly forming a $SiO_2$ film on a surface of a SiC substrate by thermal oxidation, a Si thin film is deposited on the surface of the SiC substrate and the $SiO_2$ film is subsequently formed by oxidation of the Si thin film.

As another method for reducing the interface defect density, Non-Patent Document 1 discloses a method (interface nitridation) in which thermal treatment is performed in nitric oxide (NO) gas atmosphere after a $SiO_2$ film has been formed on a surface of a SiC substrate by thermal oxidation to nitride an interface between the $SiO_2$ film and the SiC substrate.

CITATION LIST

Patent Document

PATENT DOCUMENT 1: Japanese Unexamined Patent Publication No. 11-067757

Non-Patent Document

NON-PATENT DOCUMENT 1: G. Y. Chung et al., IEEE Electron Device Lett., vol. 22, 176 (2001)
NON-PATENT DOCUMENT 2: K. Kawahara et al., Appl. Phys. Express, vol. 6, 051301 (2013)
NON-PATENT DOCUMENT 3: F. Devynck et al., Phys. Rev. B, vol. 84, 235320 (2011)
NON-PATENT DOCUMENT 4: K. Kawahara et al., J. Appl. Phys. vol. 113, 033705 (2013)

SUMMARY OF THE INVENTION

Technical Problem

The defect density at the interface between the $SiO_2$ film and the SiC substrate can be significantly reduced by the methods disclosed in the above-described documents, but the interface defect density is still high and greatly limits the characteristics of the SiC MOSFET. The method in which the interface between the $SiO_2$ film and the SiC substrate is nitrided by the NO thermal treatment progresses not only interface nitridation but also oxidation, and for this reason, is a competing process of "nitridation" and "oxidation" and is difficult to be optimized. In addition, NO gas is highly poisonous, and for this reason, is unsuitable for use in mass production.

The present invention has been made in view of the above-described points, and a main object thereof is to provide a SiC semiconductor device manufacturing method capable of significantly reducing a defect density at an interface between a $SiO_2$ film and a SiC substrate.

Solution to the Problem

The SiC semiconductor device manufacturing method according to the present invention includes a step of etching a surface of a SiC substrate with $H_2$ gas at a temperature of 1200° C. or more, a step of forming a $SiO_2$ film on the SiC substrate under conditions where the SiC substrate is not oxidized, and a step of thermally treating the SiC substrate formed with the $SiO_2$ film in $N_2$ gas atmosphere at a temperature of 1350° C. or more.

Advantages of the Invention

According to the present invention, the SiC semiconductor device manufacturing method capable of significantly reducing the defect density at the interface between the $SiO_2$ film and the SiC substrate can be provided.

DESCRIPTION OF EMBODIMENTS

Figure 1A:
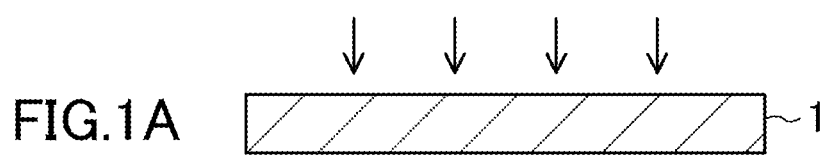
FIGS. 1A to 1D show views of a SiC semiconductor device manufacturing method in one embodiment of the present invention.

Before description of embodiments of the present invention, a situation that led up to the present invention will be described.

Upon manufacturing of a semiconductor device by use of a SiC substrate, a step of removing, with a chemical solution of, e.g., hydrofluoric acid, an oxide film formed on a surface of the SiC substrate after sacrificial oxidation of the surface of the SiC substrate is normally performed before the start of a semiconductor device manufacturing step or in the middle of the manufacturing step. In this manner, an impurity having unintentionally adhered to the surface and damage (e.g., chemical composition deviation) of a SiC crystal in the vicinity of an outermost surface can be removed, leading to stability in the characteristics of the semiconductor device and improvement in a yield.

Certainly, removal of the oxide film after sacrificial oxidation is effective to remove, e.g., the impurity having adhered to the surface of the SiC substrate and damage of the SiC crystal in the vicinity of the outermost surface, but there is a probability of many defects remaining in the surface of the SiC substrate. Actually, it has been known that due to oxidation of the SiC crystal, point defects are densely generated in the vicinity of the SiC surface (Non-Patent Document 2). Moreover, there has also been a theoretical calculation report that due to oxidation of the SiC crystal, interface defects are caused by excessive C atoms at an interface between the oxide film and SiC (Non-Patent Document 3). As described above, it is assumed that if the SiC crystal is oxidized only a little, a large amount of interface defects and SiC-side point defects cannot be avoided.

For verification, the inventor(s) of the present application et al. have conducted study on pretreatment before formation of a $SiO_2$ film on the surface of the SiC substrate, which is etching of the surface of the SiC substrate, from which the oxide film has been removed after sacrificial oxidation, with high-temperature $H_2$ gas. In addition, the inventor(s) of the present application et al. have also conducted study on $N_2$ thermal treatment as interface nitridation treatment for preventing an oxide film at an interface between the $SiO_2$ film and the SiC substrate in interface nitridation treatment by NO thermal treatment.

(Preparation of Verification Sample)

For verifying an effect of the high-temperature $H_2$ gas etching as the pretreatment and an effect of the $N_2$ thermal treatment as the interface nitridation treatment, a sample formed with a $SiO_2$ film on a surface of a SiC substrate was prepared by a method shown in FIGS. 1A to 1D.

As shown in FIG. TA, a surface of a SiC substrate 1 was, as a pretreatment step, etched with high-temperature $H_2$ gas. The etching with $H_2$ gas was performed under conditions of a $H_2$ flow rate: 1000 sccm, a temperature: 1300° C., a pressure: 0.1 MPa, and a time: 3 minutes.

Note that one formed with a SiC epitaxial layer (not shown) on the SiC substrate 1 was used as the SiC substrate 1. An n-type 4H—SiC (0001) substrate was used as the SiC substrate 1, and the donor concentration of a SiC epitaxial growth layer was $5 \times 10^{15}$ $cm^{-3}$. Before the pretreatment step, an oxide film was removed after sacrificial oxidation of a surface of the SiC epitaxial layer.

Figure 1B:
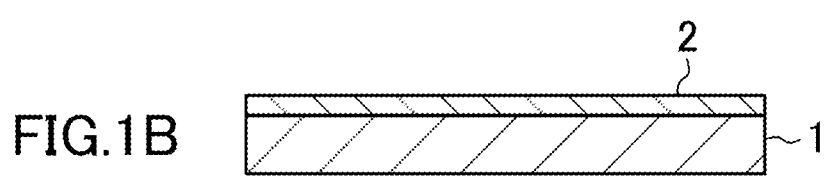

Next, a Si thin film 2 was deposited on the SiC substrate 1 by a CVD method, as shown in FIG. 1B. The Si thin film 2 was deposited under conditions of a $SiH_4$ flow rate: 50 sccm, a $H_2$ flow rate: 50 sccm, a temperature: 630° C., a pressure: 173 Pa, and a time: 90 seconds. In this manner, the Si thin film 2 with a thickness of about 18 nm was formed on the SiC substrate 1.

Figure 1C:
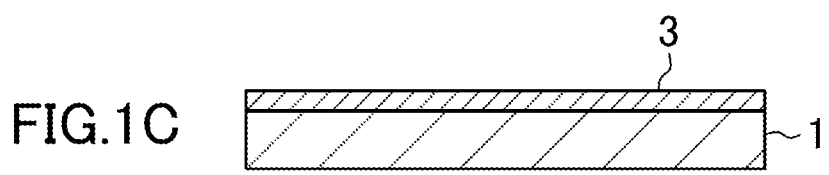

Next, the Si thin film 2 was thermally oxidized, and a $SiO_2$ film 3 was formed accordingly, as shown in FIG. 1C. The Si thin film 2 was thermally oxidized under conditions of an $O_2$ flow rate: 2000 sccm, a temperature: 750° C., and a time: 24 hours. Note that these conditions are preferably within a temperature range of 750 to 850° C. under conditions where the SiC substrate 1 is not oxidized. If the temperature exceeds 850° C., it is not preferred because of a probability of the SiC substrate 1 being oxidized.

Figure 1D:
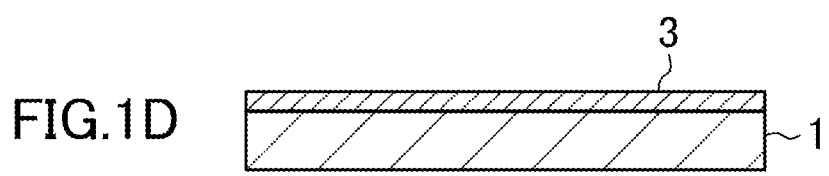

Next, the SiC substrate 1 formed with the $SiO_2$ film 3 was thermally annealed in $N_2$ gas atmosphere, as shown in FIG. 1D. Conditions for the thermal treatment were an $N_2$ flow rate: 500 sccm, a temperature: 1600° C., a pressure: 1 atmospheric pressure, and a time: 1 minute.

Note that for comparison, a sample was prepared in such a manner that a $SiO_2$ film is formed on a SiC substrate by NO gas thermal treatment as the interface nitridation treatment shown in FIG. 1D without the pretreatment by etching with high-temperature $H_2$ gas as shown in FIG. 1A.

(Analysis of Interface Defect Density)

A MOS capacitor was prepared using the $SiO_2$ film 3 formed by the method shown in FIGS. 1A to 1D, and a defect density at an interface between the $SiO_2$ film 3 and the SiC substrate 1 was obtained by a high-low CV method.

Figure 2:
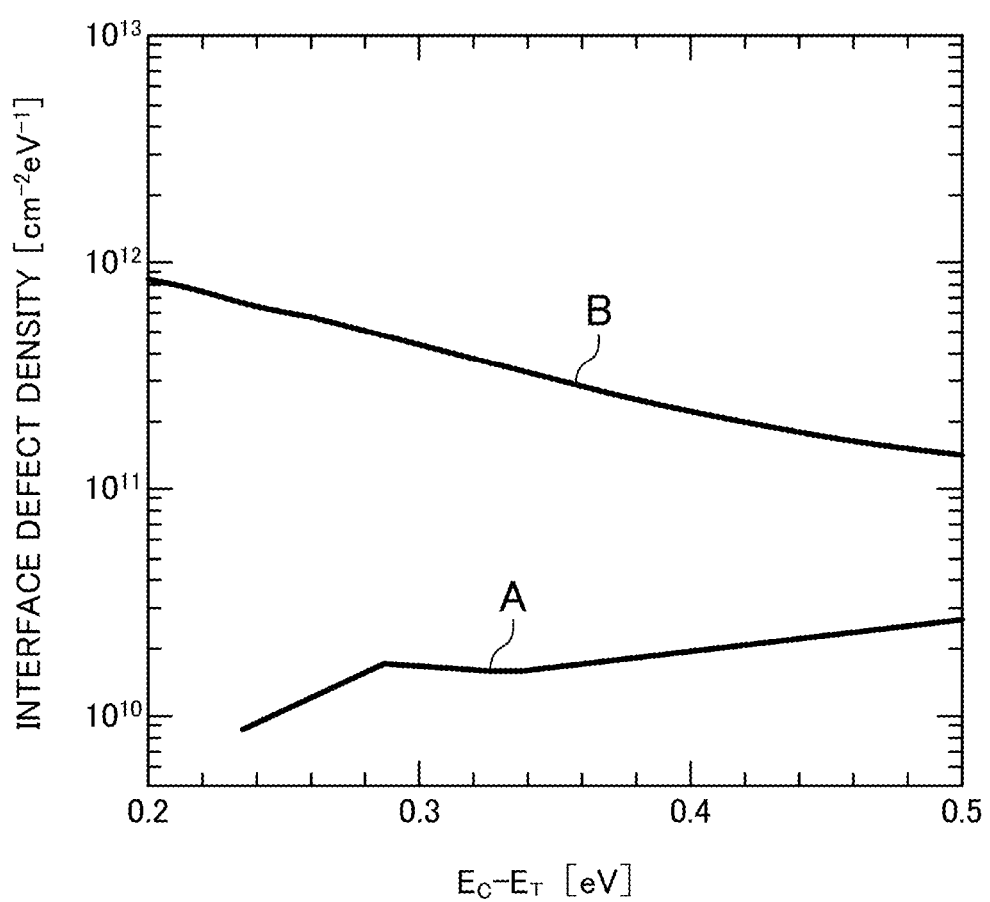
FIG. 2 shows graphs of a defect density at an interface between a $SiO_2$ film and a SiC substrate.

FIG. 2 shows graphs of results, the horizontal axis indicating an energy (ET) from a conduction band edge (Ec) and the vertical axis indicating the interface defect density. The graph indicated by A shows a case where the etching with high-temperature $H_2$ gas was performed as the pretreatment and the thermal treatment with $N_2$ gas was performed at the interface nitridation treatment, and the graph indicated by B shows a case where the etching with high-temperature $H_2$ gas was not performed as the pretreatment and the thermal treatment with NO gas was performed as the interface nitridation treatment.

As shown in FIG. 2, the sample (the graph A) subjected to the $H_2$ gas etching as the pretreatment shows that an interface defect level density (hereinafter merely referred to as an "interface defect density") was $3 \times 10^{10}$ $cm^{-2}$ $eV^{-1}$ or less across a wide energy range and was significantly reduced as compared to the sample (the graph B) not subjected to the $H_2$ gas etching as the pretreatment.

Particularly, in the vicinity of an energy lower than the conduction band edge (Ec) by 0.3 eV, the interface defect density was $3 \times 10^{10}$ $cm^{-2}$ $eV^{-1}$ or less. This energy range is close to a Fermi level upon ON (current flow) of an n-channel MOSFET, and therefore, a low defect density in this energy range means that a channel resistance in a SiC MOSFET can be significantly reduced.

Such analysis results show that many defects remain in the surface of the SiC substrate 1 from which the oxide film was removed after sacrificial oxidation of the surface and it is effective to etch the surface of the SiC substrate 1 with high-temperature $H_2$ gas in order to efficiently remove these defects.

(Analysis of SiC Substrate Side Defect)

The MOS capacitor was prepared using the $SiO_2$ film 3 formed by the method shown in FIGS. TA to 1D, and defects on a SiC substrate side were analyzed. Specifically, the types of defects on the SiC substrate side were analyzed by a deep level transient spectroscopy (DLTS) method.

Figure 3:
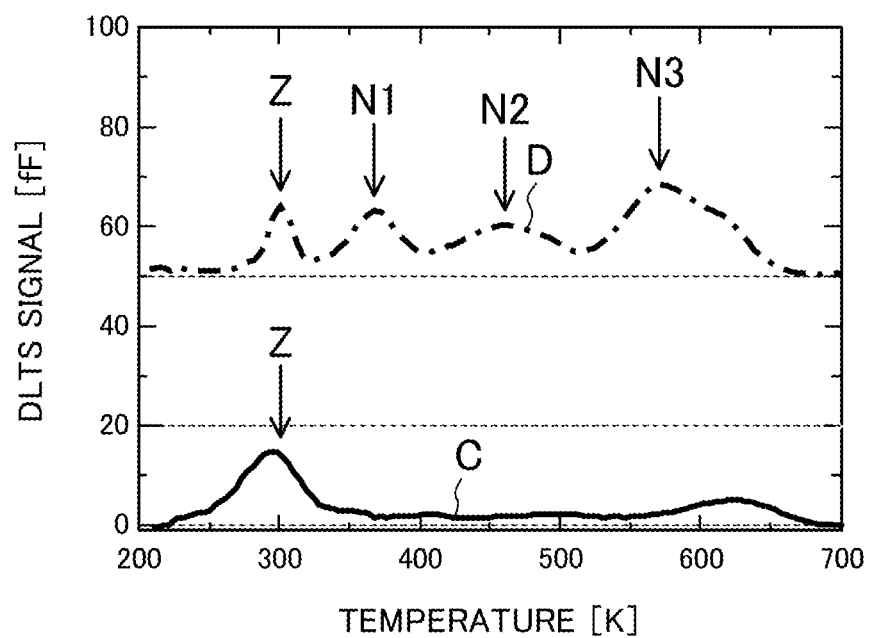
FIG. 3 shows graphs of the types of defects on a SiC substrate side.

FIG. 3 shows graphs of results, the horizontal axis indicating a temperature and the vertical axis indicating a DLTS signal. The graph indicated by C shows a case where the etching with high-temperature $H_2$ gas was performed as the pretreatment and the thermal treatment with $N_2$ gas was performed as the interface nitridation treatment. Moreover, the graph indicated by D shows a case where the etching with high-temperature $H_2$ gas was not performed as the pretreatment and the thermal treatment with NO gas was performed as the interface nitridation treatment.

As shown in FIG. 3, in the sample (the graph C) subjected to the thermal treatment with $N_2$ gas, only a peak indicated by an arrow Z was observed. On the other hand, in the sample (the graph D) subjected to the thermal treatment with NO gas, three peaks indicated by arrows N1, N2, N3 were observed in addition to a peak indicated by an arrow Z. It has been known that the peak indicated by the arrow Z is due to a crystal fault (a carbon vacancy) created in the SiC substrate 1 upon SiC crystal growth. On the other hand, the peaks indicated by the arrows N1, N2, N3 correspond to defects generated in the vicinity of the SiC surface due to thermal oxidation of the SiC substrate 1 (Non-Patent Document 2).

These results show that in a case where the thermal treatment with NO gas is performed as the interface nitridation treatment, the surface of the SiC substrate 1 is slightly oxidized during the interface nitridation treatment. On the other hand, the results show that in a case where the thermal treatment with $N_2$ gas is performed as the interface nitridation treatment, the surface of the SiC substrate 1 is not oxidized.

Moreover, these results indicate that even when the SiC surface is cleaned and the quality thereof is enhanced by the high-temperature $H_2$ gas etching, if SiC is oxidized even a little in a step thereafter, a sufficiently-low interface defect density cannot be obtained.

For example, the sample subjected to the interface nitridation treatment with NO gas has been described above, but similar DLTS peaks N1, N2, N3 were also observed in a sample for which a Si thin film 2 was deposited after the etching with high-temperature $H_2$ gas and the nitridation treatment with $N_2$ gas was performed at a high temperature (1600° C.) after formation of a $SiO_2$ film 3 by high-temperature (950° C.) oxidation. This means that a surface of the SiC substrate 1 is oxidized upon the oxidation treatment at 950° C.

That is, even if defects in the vicinity of the SiC substrate surface are removed by the high-temperature $H_2$ gas etching, if oxidation is performed at a high temperature (950° C.) upon formation of the $SiO_2$ film 3 by oxidation of the Si thin film 2, the surface of the SiC substrate 1 is slightly oxidized. For this reason, even if the nitridation treatment with $N_2$ gas is performed thereafter at a high temperature (1600° C.), a sufficiently-low interface defect density cannot be obtained.

Note that the sample used for verification was prepared using the n-type SiC substrate, but the types of defects on the SiC substrate side were also analyzed by the DLTS method for a sample prepared using a p-type SiC substrate by the same method as that shown in FIGS. 1A to 1D.

Figure 4:
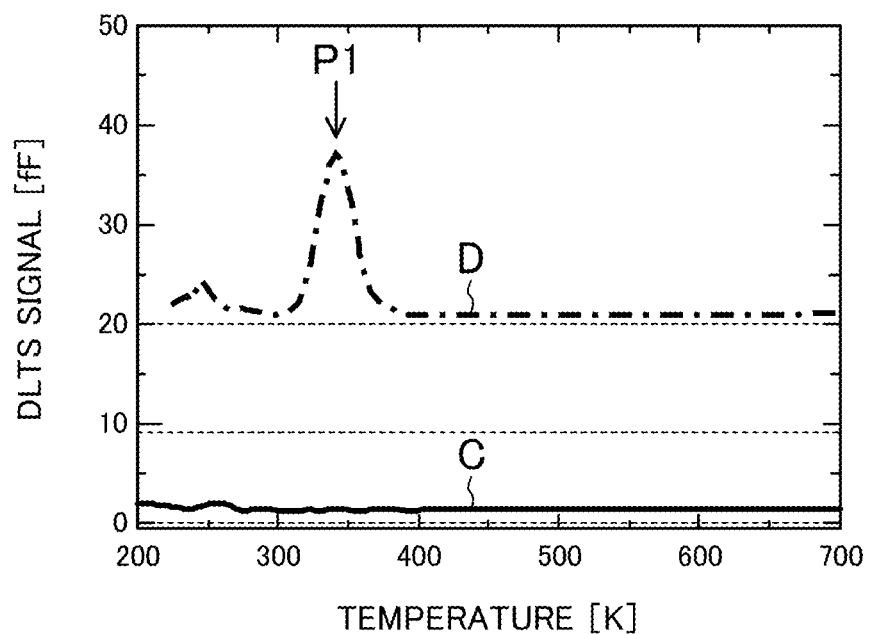
FIG. 4 shows graphs of the types of defects on the SiC substrate side.

FIG. 4 shows graphs of results, and the graph indicated by C shows a case where the $H_2$ gas etching was performed as the pretreatment and the thermal treatment with $N_2$ gas was performed as the interface nitridation treatment. Moreover, the graph indicated by D shows a case where the $H_2$ gas etching was not performed as the pretreatment and the thermal treatment with NO gas was performed as the interface nitridation treatment.

As shown in FIG. 4, in the sample (the graph C) subjected to the thermal treatment with $N_2$ gas, no peak due to a point defect in a SiC crystal was observed. However, in the sample (the graph D) subjected to the thermal treatment with NO gas, a peak indicated by an arrow P1 was observed. It has been known that the peak indicated by P1 is due to a defect generated in the vicinity of the SiC surface due to thermal oxidation of the SiC substrate 1 (Non-Patent Document 4).

These results show that even in the case of using the p-type SiC substrate, the surface of the SiC substrate 1 was oxidized in the case of performing the thermal treatment with the NO gas as the interface nitridation treatment, but was not oxidized in the case of performing the thermal treatment with $N_2$ gas.

Table 1 shows energy positions and defect densities for the types OX-N1, OX-N2, OX-N3, OX-P1 of defects indicated by the arrows N1 to N3, P1. Here, Ec is an energy level at the conduction band edge, and Ev is an energy level at a valance band edge. Note that the energy position was obtained by analysis of dependency, which is obtained by DLTS measurement, of a temperature on the time constant of carrier emission. Moreover, the defect density was obtained from a peak intensity obtained in DLTS measurement.

TABLE 1

| Type of Defect | Energy Position | Defect Density |
|---|---|---|
| OX-N1 | Ec − 0.8 eV | up to $1 \times 10^{13}$ cm$^{-3}$ |
| OX-N2 | Ec − 1.0 eV | up to $5 \times 10^{12}$ cm$^{-3}$ |
| OX-N3 | Ec − 1.6 eV | up to $2 \times 10^{13}$ cm$^{-3}$ |
| OX-P1 | Ev + 0.7 eV | up to $1 \times 10^{13}$ cm$^{-3}$ |

From Table 1, in a case where the $H_2$ thermal treatment is performed as the pretreatment and the thermal treatment with $N_2$ gas is performed as the interface nitridation treatment, point defects on the SiC substrate side are estimated, for the following reason, such that a point defect density at an energy lower than the conduction band edge by 1.0 eV is $5 \times 10^{11}$ cm$^{-3}$ or less. Moreover, it is estimated that a point defect density at an energy higher than the valance band edge by 0.7 eV is $5 \times 10^{11}$ cm$^{-3}$ or less.

That is, no DLTS peaks corresponding to these point defects are observed in the sample subjected to the $H_2$ thermal treatment as the pretreatment and the thermal treatment with $N_2$ gas as the interface nitridation treatment, as shown in FIGS. 3 and 4. As a result of simulation of DLTS peaks by numerical calculation by use of the properties of defects observed in other samples, it has been found that if the point defect density is at least $5 \times 10^{11}$ cm$^{-3}$ or more, significant DLTS peaks are observed under these measurement conditions. Thus, it is estimated that a point defect density on the SiC substrate side in an unoxidized sample is $5 \times 101$ cm$^{-3}$ or less.

(Property Evaluation on $SiO_2$ Film)

For the $SiO_2$ film 3 formed by the method shown in FIGS. 1A to 1D, e.g., the properties of the $SiO_2$ film were evaluated by the following method in order to check the effect of the etching with high-temperature $H_2$ gas and the effect of the $N_2$ thermal treatment as the interface nitridation treatment.

(A) Evaluation on C—V Shift by Voltage Stress

The MOS capacitor was prepared using the $SiO_2$ film 3 formed by the method shown in FIGS. 1A to 1D, and a property shift by voltage stress was evaluated. Specifically, a voltage of 10 V was applied to the MOS capacitor for 300 seconds, and thereafter, a bias was swept from a positive voltage to a negative voltage. Then, a voltage of −10 V was applied for 300 seconds, and thereafter, the bias was swept from the negative voltage to the positive voltage. Then, a C—V shift was measured.

Figure 5:
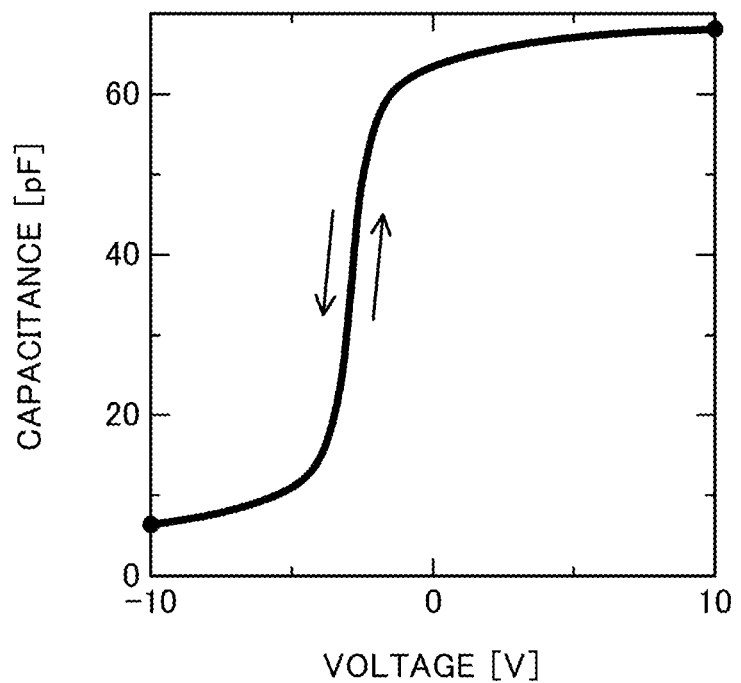
FIG. 5 shows a graph of C-V characteristics of the $SiO_2$ film/the SiC substrate.

FIG. 5 shows a graph of results, the horizontal axis indicating a voltage and the vertical axis indicating a capacitance. As shown in FIG. 5, even after a high electric field (3.3 MV/cm) had been applied to the $SiO_2$ film, no C—V shift was observed at all. This result indicates that traps in the $SiO_2$ film are extremely small in amount.

(B) Insulating Property Evaluation on $SiO_2$ Film

The MOS capacitor was prepared using the $SiO_2$ film 3 formed by the method shown in FIGS. 1A to 1D, and insulating properties of the $SiO_2$ film 3 were evaluated. Specifically, a positive voltage was applied to the MOS capacitor, and I-V characteristics were measured.

Figure 6:
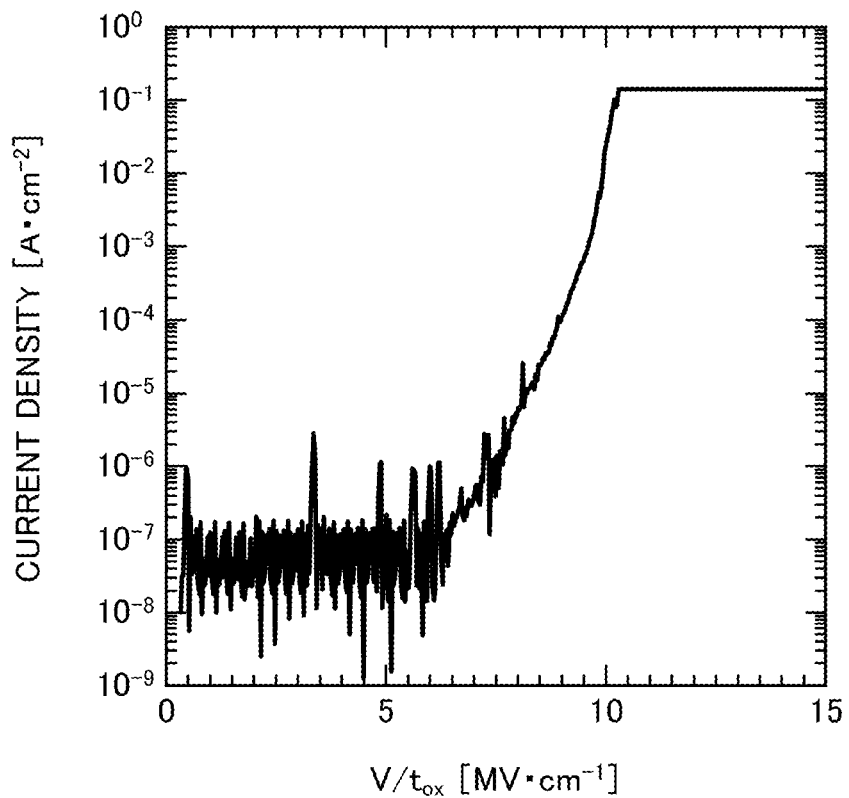
FIG. 6 shows a graph of I-V characteristics of the $SiO_2$ film.

FIG. 6 shows a graph of results, the horizontal axis indicating an electric field (V/$t_{ox}$; tox is the thickness of the $SiO_2$ film 3) and the vertical axis indicating a current density. As shown in FIG. 6, breakdown of the $SiO_2$ film 3 occurred at an electric field of 10 $MVcm^{-1}$, and favorable insulating properties were exhibited. Moreover, a Fowler-Nordheim tunnel current was observed within a range of 6 to 9 $MVcm^{-1}$. This indicates that defects in the $SiO_2$ film is small in amount.

(C) Nitrogen Atom Density at $SiO_2$/SiC Interface

In order to verify the effect of the interface nitridation treatment with $N_2$ gas, a nitrogen atom density at the interface between the $SiO_2$ film 3 and the SiC substrate 1 was measured by secondary ion mass spectrometry (SIMS).

Figure 7:
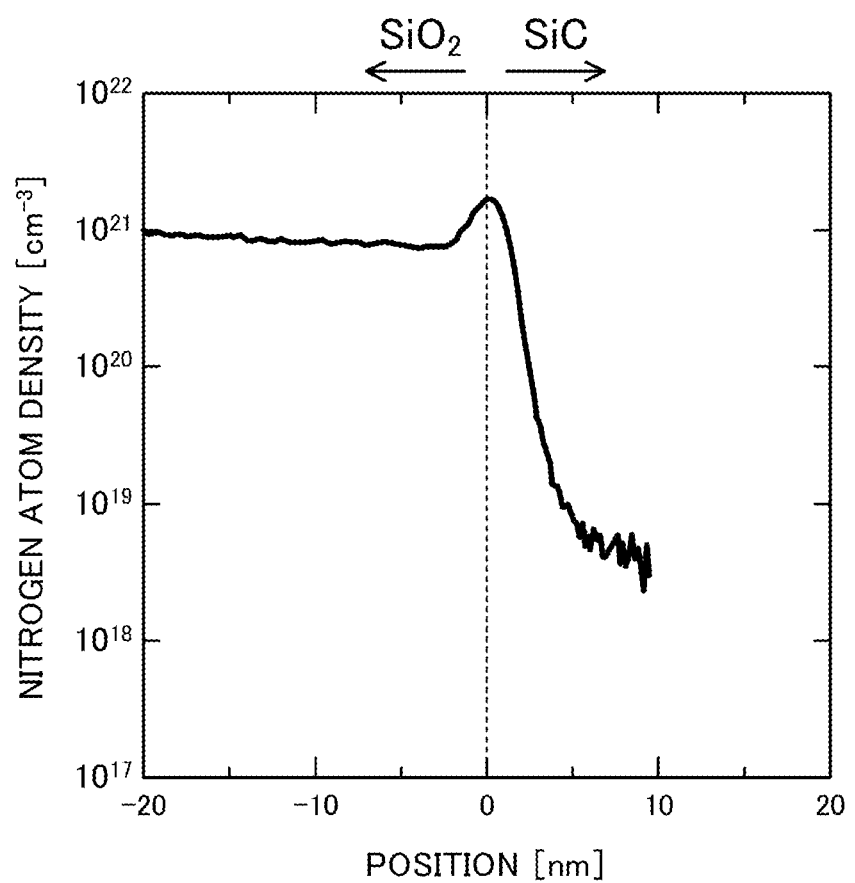
FIG. 7 shows a graph of a nitrogen atom density in the vicinity of the interface between the $SiO_2$ film and the SiC substrate.

FIG. 7 shows a graph of results, the horizontal axis indicating a position in a film thickness direction, zero indicating the interface between the $SiO_2$ film 3 and the SiC substrate 1, a positive side indicating a position in the SiC substrate, and a negative side indicating a position in the $SiO_2$ film. Moreover, the vertical axis indicates a nitrogen atom density.

As shown in FIG. 7, nitrogen atoms were present at a density of about $2 \times 10^{21}$ $cm^{-3}$ at the interface between the $SiO_2$ film 3 and the SiC substrate 1. Further, nitrogen atoms were also distributed at a density of about $1 \times 10^{21}$ $cm^{-3}$ in the $SiO_2$ film.

These results show that the nitrogen atoms are, at a sufficient density, introduced into the interface between the $SiO_2$ film and the SiC substrate and into the $SiO_2$ film by the thermal treatment with $N_2$ gas. Accordingly, it is assumed that the defect density at the interface between the $SiO_2$ film and the SiC substrate is sufficiently reduced.

According to the above-described results, the surface of the SiC substrate 1 from which the oxide film has been removed after sacrificial oxidation of the surface is etched with high-temperature $H_2$ gas, so that the defects remaining in the vicinity of the surface of the SiC substrate 1 can be significantly reduced. Moreover, the SiC substrate 1 is thermally treated in $N_2$ gas atmosphere after the $SiO_2$ film 3 has been formed on the surface of the SiC substrate 1 under the conditions where the SiC substrate 1 is not oxidized, so that oxidation of the surface of the SiC substrate 1 can be prevented. Accordingly, the defect density at the interface between the $SiO_2$ film and the SiC substrate can be significantly reduced, and the $SiO_2$ film can be obtained with a high quality and stable properties.

(Dependency of Gas Etching Temperature on Interface Defect Density)

Figure 8:
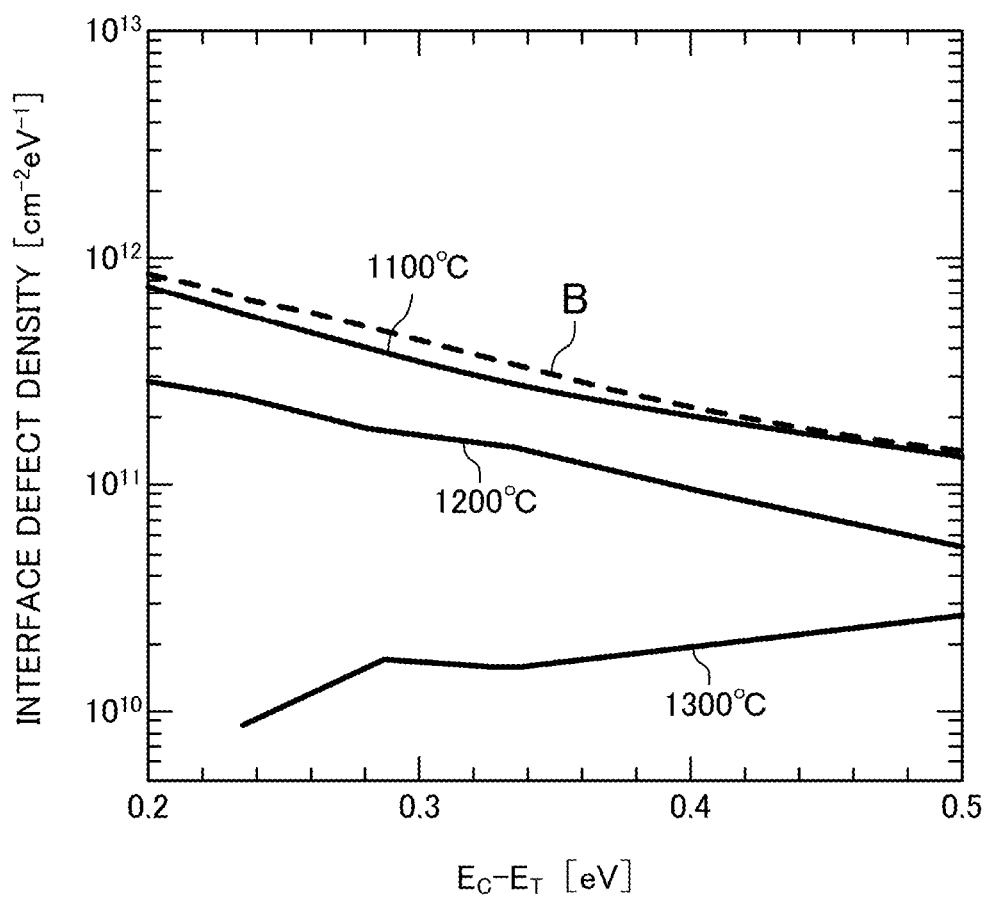
FIG. 8 shows graphs of dependency of a $H_2$ gas etching temperature on an interface defect density.

FIG. 8 shows a graph of results of measurement of the interface defect density in a case where a temperature in etching of the surface of the SiC substrate 1 with high-temperature $H_2$ gas is 1100° C., 1200° C., and 1300° C. Note that measurement was performed by the above-described high-low CV method. Moreover, a dashed graph indicated by B in the figure indicates a case where no etching with high-temperature $H_2$ gas was performed.

FIG. 8 shows that the interface defect density is significantly reduced at a temperature of 1200° C. or more. On the other hand, almost no effect of the etching with $H_2$ gas was observed at a temperature of 1100° C. This may be because the SiC substrate was etched little at a temperature of 1100° C. Note that a temperature of 1400° C. or more is a temperature exceeding the melting point of Si, and for this reason, it is difficult to maintain the chemical composition of the SiC substrate surface at a normal value. Thus, in order to obtain an effect of reducing the interface defect density, the etching with $H_2$ gas is preferably performed within a temperature range of 1200° C. to 1300° C.

(Dependency of $N_2$ Gas Thermal Treatment Temperature on Interface Defect Density)

Figure 9:
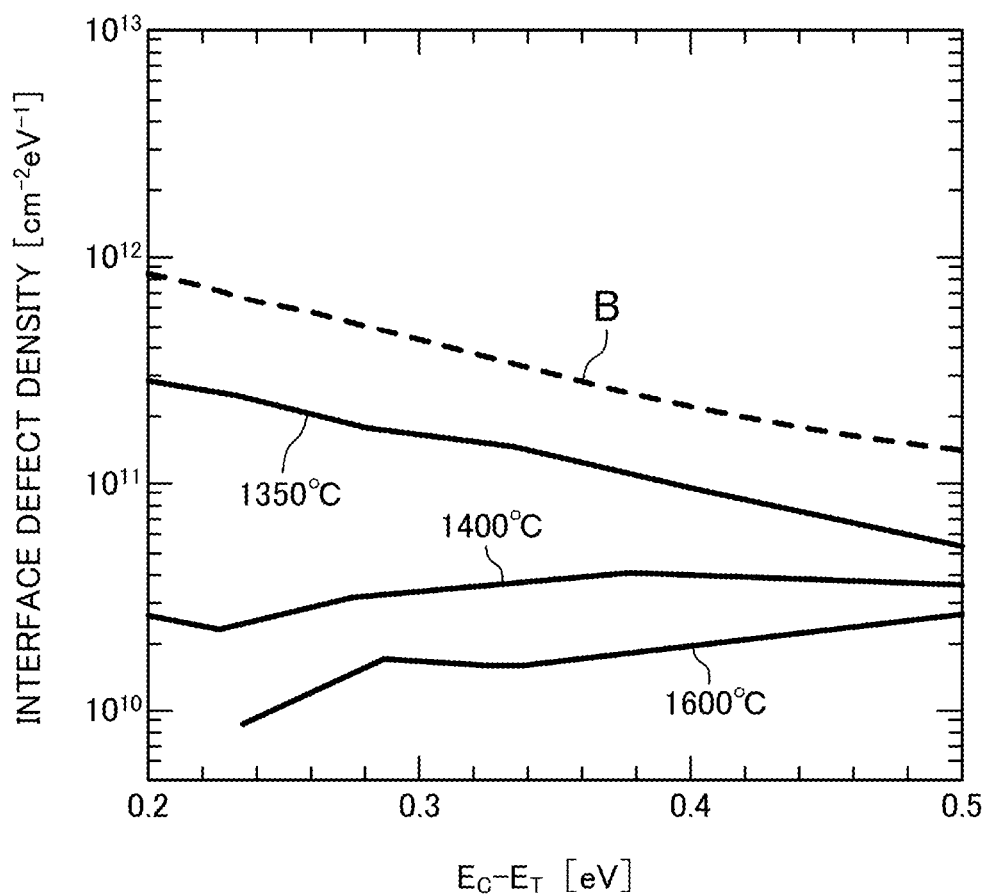
FIG. 9 shows graphs of dependency of a $N_2$ gas thermal treatment temperature on the interface defect density.

FIG. 9 shows graphs of results of measurement of the interface defect density in a case where a temperature in the thermal treatment (the interface nitridation treatment) of the SiC substrate 1 in $N_2$ gas atmosphere after formation of the $SiO_2$ film 3 on the surface of the SiC substrate 1 is 1350° C., 1400° C., and 1600° C. Note that measurement was performed by the above-described high-low CV method. Moreover, a dashed graph indicated by B in the figure indicates a case where no etching with high-temperature $H_2$ gas was performed (the interface nitridation treatment was performed with NO gas).

FIG. 9 shows that the interface defect density is significantly reduced at a temperature of 1350° C. or more. On the other hand, almost no effect of the $N_2$ gas thermal treatment was observed at a temperature of less than 1350° C. This may be because the nitrogen atoms were not introduced, at a sufficient density, into the interface between the $SiO_2$ film 3 and the SiC substrate 1 at a temperature of less than 1350° C. Note that thermal decomposition of the $SiO_2$ film surface begins at a temperature of 1700° C. or more, and for this reason, it is difficult to maintain the quality of the $SiO_2$ film. Thus, in order to obtain an effect of reducing the interface defect density, the thermal treatment (the interface nitridation treatment) in $N_2$ gas atmosphere is preferably performed within a temperature range of 1350° C. to 1600° C.

Figure 10:
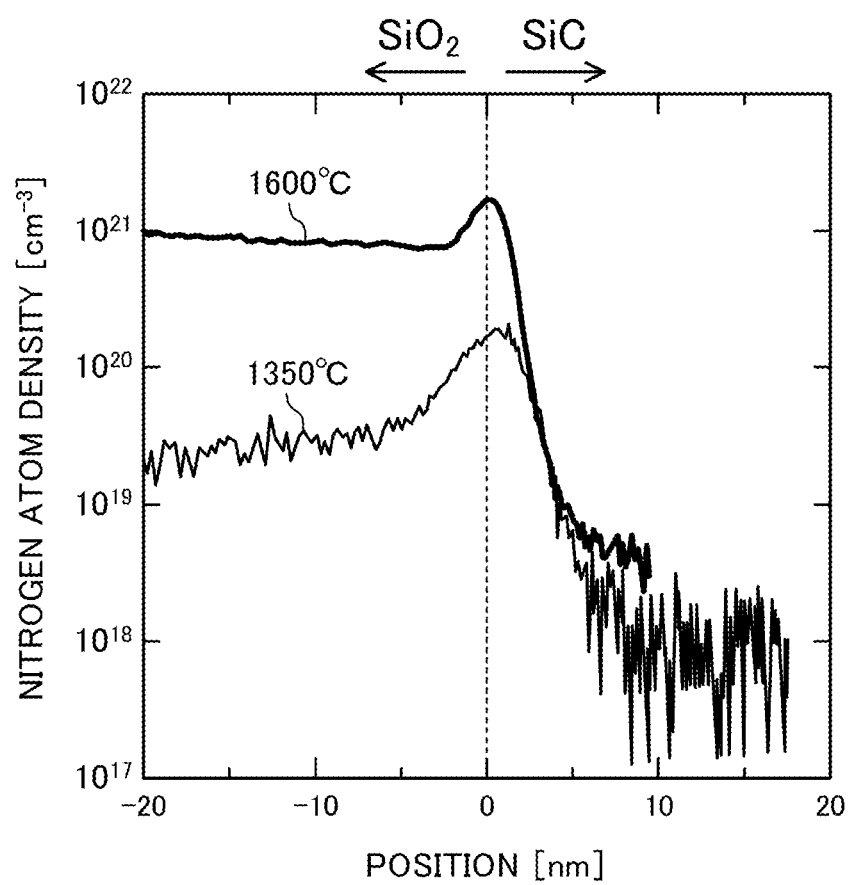
FIG. 10 shows graphs of the nitrogen atom density in the vicinity of the $SiO_2$/SiC interface.

FIG. 10 shows graphs of results of measurement of the nitrogen atom density at the $SiO_2$/SiC interface in a case where a temperature in the thermal treatment (the interface nitridation treatment) in $N_2$ gas atmosphere is 1350° C. and 1600° C. Note that measurement was performed by the above-described secondary ion mass spectrometry (SIMS).

As shown in FIG. 10, in a case where the interface nitridation treatment is performed at a temperature of 1350° C. or more, the nitrogen atoms are present at a density of $2 \times 10^{19}$ $cm^{-3}$ or more at the interface between the SiC substrate and the $SiO_2$ film and in the $SiO_2$ film.

As described above, the method for manufacturing the SiC semiconductor device in the present embodiment includes a step of etching the surface of the SiC substrate 1 with $H_2$ gas at a temperature of 1200° C. or more, a step of depositing the Si thin film 2 on the SiC substrate 1 by the CVD method, a step of thermally oxidizing the Si thin film 2 at the temperature at which the SiC substrate 1 is not oxidized to form the $SiO_2$ film 3, and a step of thermally treating the SiC substrate 1 formed with the $SiO_2$ film 3 in $N_2$ gas atmosphere at a temperature of 1350° C. or more. With this configuration, the defect density at the interface between the $SiO_2$ film 3 and the SiC substrate 1 can be significantly reduced, and the $SiO_2$ film 3 can be obtained with a high quality and stable properties.

Other Embodiments

In the above-described embodiment, the $SiO_2$ film 3 is formed in such a manner that the Si thin film 2 is thermally oxidized at the temperature at which the SiC substrate 1 is not oxidized after the Si thin film 2 has been deposited on the SiC substrate 1. Thus, the surface of the SiC substrate 1 is not oxidized. Moreover, the thermal treatment in high-temperature $N_2$ gas atmosphere is, after formation of the $SiO_2$ film 3, performed as the interface nitridation treatment so that the state in which the surface of the SiC substrate 1 is not oxidized can be maintained.

That is, as long as the $SiO_2$ film 3 is, under the conditions where the SiC substrate 1 is not oxidized, formed on the SiC substrate 1 after etching of the surface of the SiC substrate 1 with high-temperature $H_2$ gas, the defect density at the interface between the $SiO_2$ film 3 and the SiC substrate 1 can be significantly reduced in such a manner that the SiC substrate 1 formed with the $SiO_2$ film 3 is subsequently thermally treated in high-temperature $N_2$ gas atmosphere.

Figure 11A:
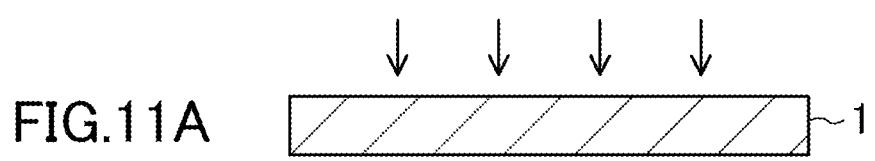
FIGS. 11A to 11C show views of a SiC semiconductor device manufacturing method in another embodiment of the present invention.
Figure 11B:
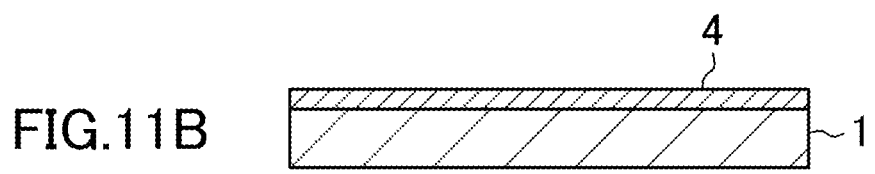
Figure 11C:
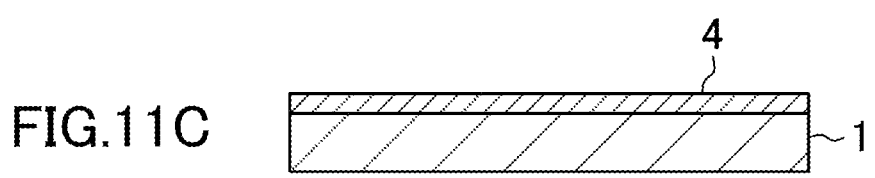

FIGS. 11A to 11C are views showing another method for forming the $SiO_2$ film on the SiC substrate under the conditions where the SiC substrate is not oxidized.

As shown in FIG. 11A, the surface of the SiC substrate 1 is, as the pretreatment step, etched with high-temperature $H_2$ gas. The etching with $H_2$ gas may be performed under conditions of a $H_2$ flow rate: 1000 sccm, a temperature: 1300° C., a pressure: 0.1 MPa, and a time: 3 minutes, for example.

Note that one formed with the SiC epitaxial layer (not shown) on the SiC substrate 1 may be used as the SiC substrate 1. Moreover, before the pretreatment step, the oxide film is preferably removed after sacrificial oxidation of the surface of the SiC epitaxial layer. Note that for the following reason, the etching with $H_2$ gas is preferably performed under Si excess atmosphere. For example, $SiH_4$ gas may be, at a flow rate of about 0.01 to 0.1 sccm, added to $H_2$ gas.

Next, as shown in FIG. 11B, a $SiO_2$ film 4 is deposited on the SiC substrate 1 by a plasma CVD method. The $SiO_2$ film 4 may be deposited under the conditions where the SiC substrate 1 is not oxidized, such as a tetraethoxysilane (TEOS) flow rate: 0.3 sccm, an $O_2$ flow rate: 450 sccm, a temperature: 400° C., a pressure: 43 Pa, a high-frequency power: 100 W, and a time: 30 minutes.

Note that the $SiO_2$ film 4 may be performed by a thermal CVD method. In this case, the $SiO_2$ film 4 may be performed under the conditions where the SiC substrate 1 is not oxidized, such as a $SiH_4$ flow rate: 5 sccm, a $N_2O$ flow rate: 300 sccm, a $N_2$ flow rate: 3000 sccm, a temperature: 720° C., a pressure: 15 kPa, and a time: 4 minutes.

Since $O_2$ gas or $N_2O$ gas is contained in reactive gas even in a case where the $SiO_2$ film 4 is deposited under these conditions, the surface of the SiC substrate 1 is slightly oxidized at an initial stage of deposition in some cases. However, even in this case, an extremely-thin Si layer, about one- to three-monolayer-thick Si film, is formed on the surface of the SiC substrate 1 in such a manner that the etching with $H_2$ gas as shown in FIG. 11A is performed in Si excess atmosphere, and therefore, only these extremely-thin Si layers are oxidized, and the surface of the SiC substrate 1 is not oxidized.

Next, the SiC substrate 1 formed with the $SiO_2$ film 4 is thermally treated in $N_2$ gas atmosphere, as shown in FIG. 11C. The thermal treatment may be performed under conditions such as a $N_2$ flow rate: 500 sccm, a temperature: 1600° C., a pressure: 1 atmospheric pressure, and a time: 1 minute.

(Dependency of $H_2$ Gas Etching Temperature on Interface Defect Density)

Figure 12:
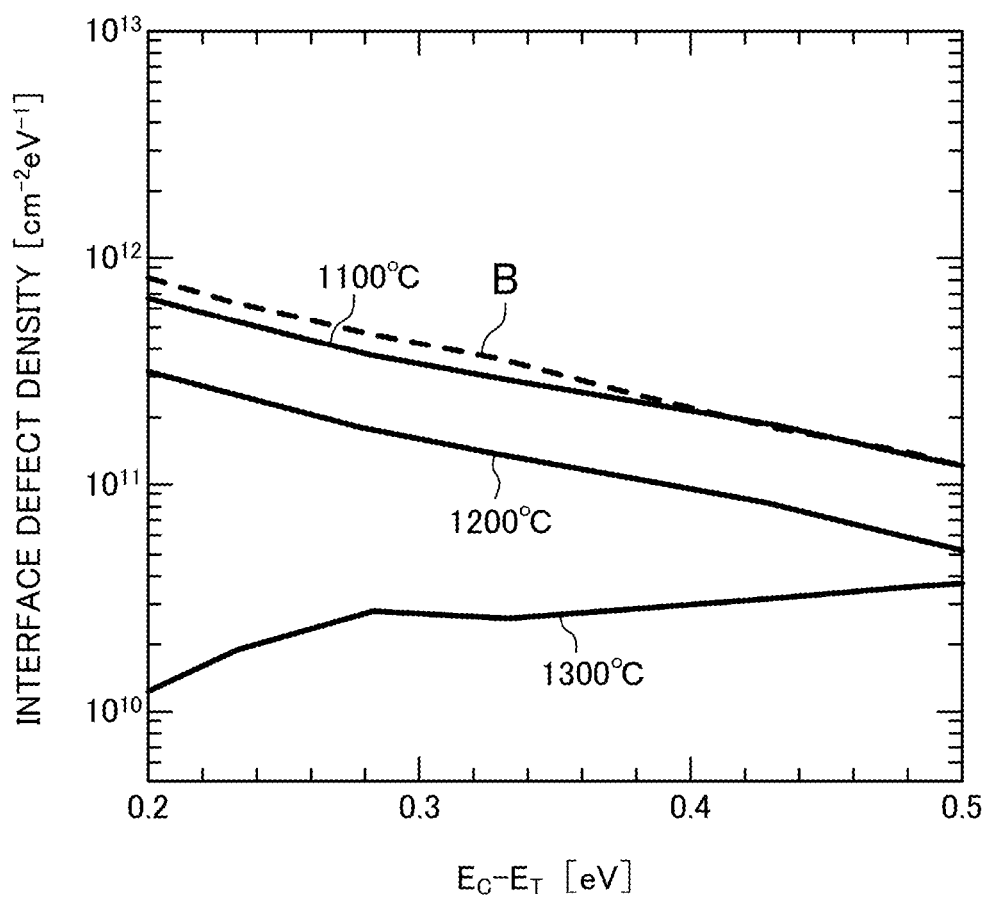
FIG. 12 shows graphs of dependency of a $H_2$ gas etching temperature on an interface defect density.

FIG. 12 shows graphs of dependency of the $H_2$ gas etching temperature on the interface defect density at an interface between the $SiO_2$ film 4 and the SiC substrate 1 when the $SiO_2$ film 4 is formed by the method shown in FIGS. 11A to 11C. Note that measurement was performed by the above-described high-low CV method. Moreover, a dashed graph indicated by B in the figure indicates a case where no etching with high-temperature $H_2$ gas was performed (the interface nitridation treatment was performed with NO gas).

FIG. 12 shows that the interface defect density is significantly reduced at a temperature of 1200° C. or more. On the other hand, almost no effect of the etching with $H_2$ gas was observed at a temperature of 1100° C. This may be because the SiC substrate was etched little at a temperature of 1100° C. Note that a temperature of 1400° C. or more is a temperature exceeding the melting point of Si, and for this reason, it is difficult to maintain the chemical composition of the SiC substrate surface at a normal value. Thus, in order to obtain an effect of reducing the interface defect density, the etching with $H_2$ gas is preferably performed within a temperature range of 1200° C. to 1300° C.

(Dependency of $N_2$ Gas Thermal Treatment Temperature on Interface Defect Density)

Figure 13:
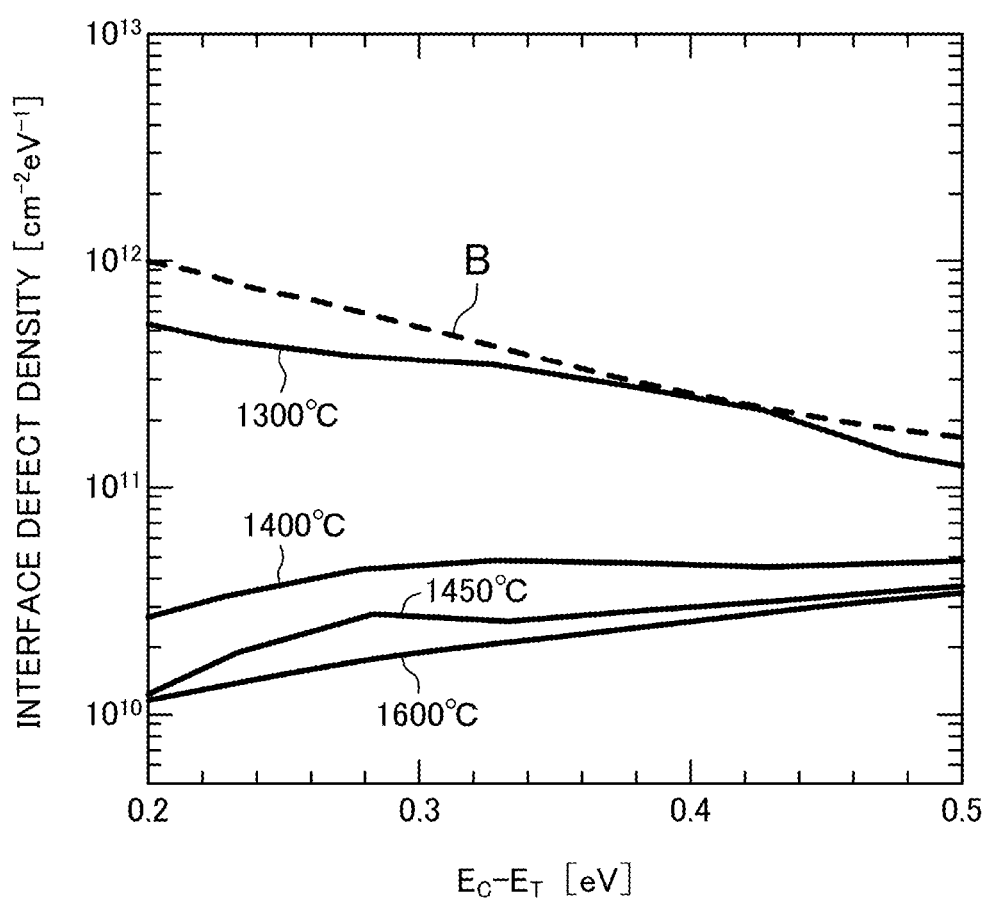
FIG. 13 shows graphs of dependency of a $N_2$ gas thermal treatment temperature on the interface defect density.

FIG. 13 shows graphs of results of measurement of the interface defect density in a case where a temperature in the thermal treatment (the interface nitridation treatment) of the SiC substrate 1 in $N_2$ gas atmosphere after formation of the $SiO_2$ film 4 on the surface of the SiC substrate 1 is 1300° C., 1400° C., 1450° C., and 1600° C. Note that measurement was performed by the above-described high-low CV method. Moreover, a dashed graph indicated by B in the figure indicates a case where no etching with high-temperature $H_2$ gas was performed (the interface nitridation treatment was performed with NO gas).

FIG. 13 shows that the interface defect density is significantly reduced at a temperature of 1400° C. or more. On the other hand, almost no effect of the $N_2$ gas thermal treatment was observed at a temperature of less than 1300° C. This may be because the nitrogen atoms were not introduced, at a sufficient density, into the interface between the $SiO_2$ film 4 and the SiC substrate 1 at a temperature of 1300° C. Note that thermal decomposition of the $SiO_2$ film surface begins at a temperature of 1700° C. or more, and for this reason, it is difficult to maintain the quality of the $SiO_2$ film. Thus, in order to obtain an effect of reducing the interface defect density, the thermal treatment (the interface nitridation treatment) in $N_2$ gas atmosphere is preferably performed within a temperature range of 1400° C. to 1600° C.

(Nitrogen Atom Density at $SiO_2$/SiC Interface)

Figure 14:
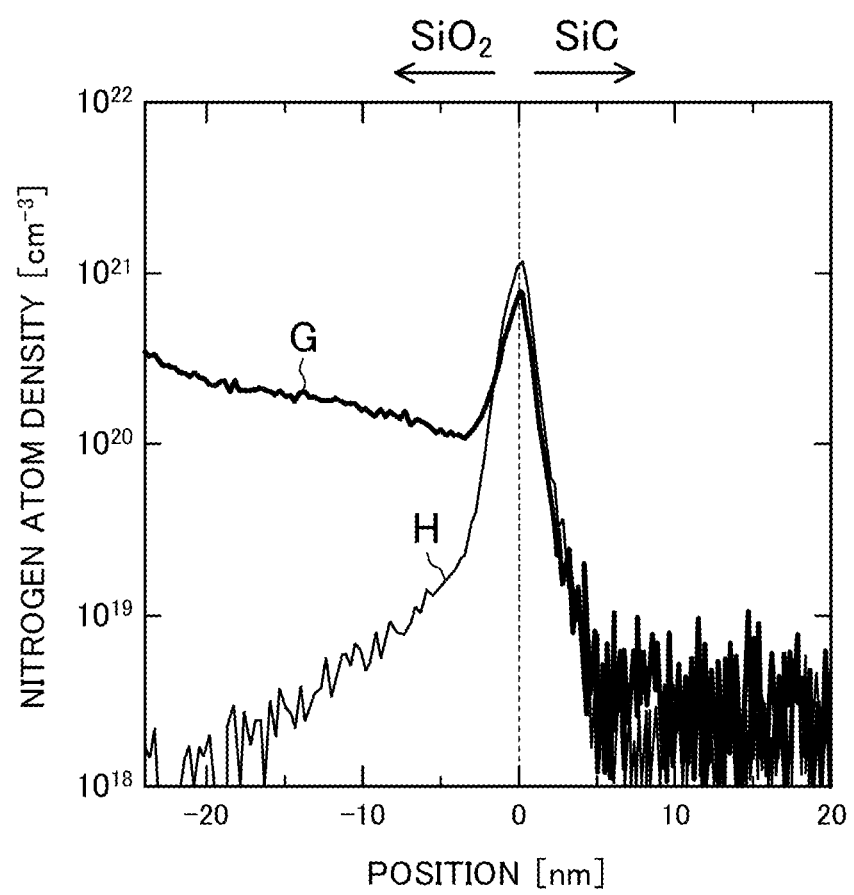
FIG. 14 shows graphs of a nitrogen atom density in the vicinity of the $SiO_2$/SiC interface.

FIG. 14 shows graphs of results of measurement of the nitrogen atom density at the interface between the $SiO_2$ film 4 and the SiC substrate 1. Measurement was performed by the above-described secondary ion mass spectrometry (SIMS). The horizontal axis indicates a position in a film thickness direction, zero indicates the interface between the $SiO_2$ film 4 and the SiC substrate 1, a positive side indicates a position in the SiC substrate, and a negative side indicates a position in the $SiO_2$ film. Moreover, the vertical axis indicates a nitrogen atom density. The graph indicated by G in the figure shows a case where the $H_2$ gas etching was performed as the pretreatment at 1300° C. and the thermal treatment with $N_2$ gas was performed as the interface nitridation treatment at 1600° C. Moreover, the graph indicated by H shows a case where the $H_2$ gas etching was not performed as the pretreatment and the thermal treatment with NO gas was performed as the interface nitridation treatment.

As shown in FIG. 14, in the case of the etching with high-temperature $H_2$ gas, nitrogen atoms are present at a density of about $2 \times 10^{21}$ $cm^{-3}$ at the interface between the $SiO_2$ film 4 and the SiC substrate 1. Further, nitrogen atoms were also distributed at a density of about $1\times10^{20}$ cm$^{-3}$ or more in the SiO$_2$ film. Note that although not shown in FIG. 14, distribution of nitrogen atoms at a density of about $2\times10^{19}$ cm$^{-3}$ or more in the SiO$_2$ film was confirmed even in a case where the thermal treatment with N$_2$ gas was performed at 1350° C. as in that shown in FIG. 10.

On the other hand, also in the case of nitridation of the interface with NO gas, nitrogen atoms are present at a density of about $2\times10^{21}$ cm$^{-3}$ at the interface between the SiO$_2$ film 4 and the SiC substrate 1, but almost no nitrogen atoms are distributed in the SiO$_2$ film.

(High-Temperature H$_2$ Etching in Si Excess Atmosphere)

As described above, even in a case where the SiO$_2$ film 4 is deposited on the SiC substrate 1 under the conditions where the SiC substrate 1 is not oxidized, O$_2$ gas or N$_2$O gas is contained in reactive gas. For this reason, the surface of the SiC substrate 1 is slightly oxidized at the initial stage of deposition in some cases. However, even in this case, an extremely-thin Si layer, about one- to three-monolayer-thick Si film, is formed on the surface of the SiC substrate 1 in such a manner that the etching with high-temperature H$_2$ gas as the pretreatment is performed in Si excess atmosphere, and therefore, only these extremely-thin Si layers are oxidized and the surface of the SiC substrate 1 is not oxidized.

Figure 15:
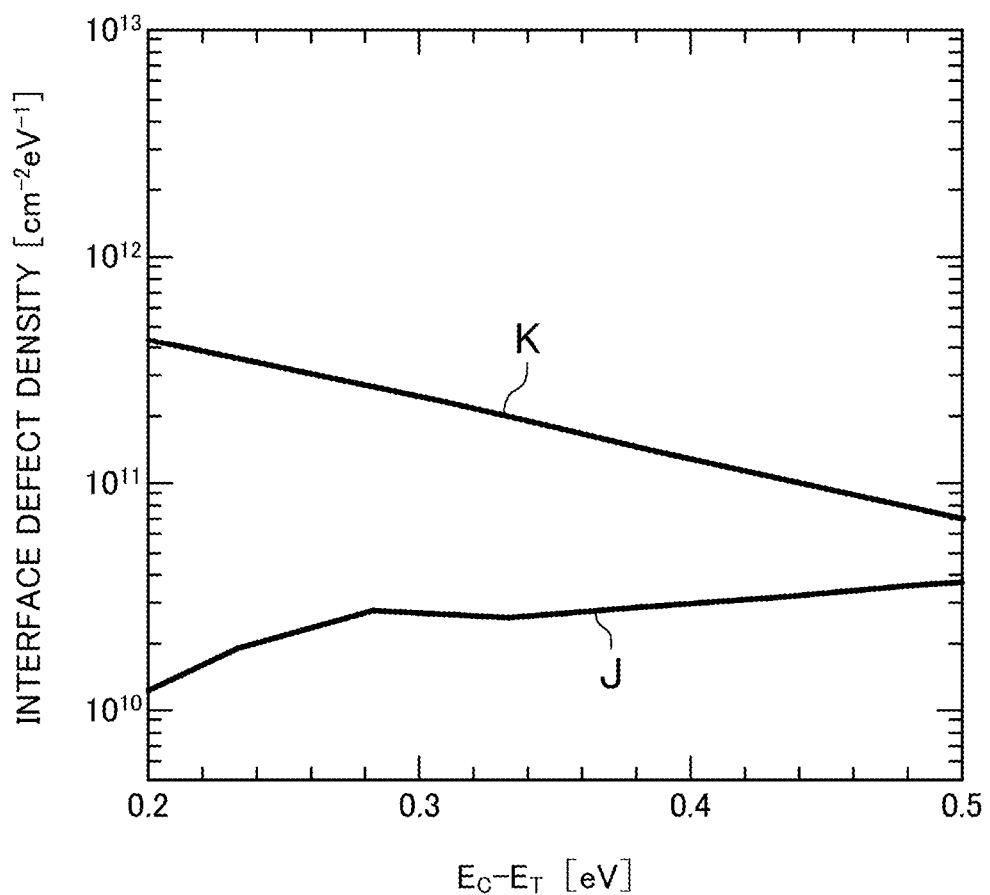
FIG. 15 shows graphs of an effect of high-temperature $H_2$ etching in Si excess atmosphere.

FIG. 15 shows graphs of results of measurement of a difference in the defect density at the interface between the SiO$_2$ film 4 and the SiC substrate 1 between the case of performing the etching with high-temperature H$_2$ gas in Si excess atmosphere and the case of not performing the etching in Si excess atmosphere. The graph indicated by J shows the case of performing the etching in Si excess atmosphere, and the graph indicated by K shows the case of not performing the etching in Si excess atmosphere.

The etching with high-temperature H$_2$ gas was performed under conditions of a H$_2$ flow rate: 1000 sccm, a temperature: 1300° C., a pressure: 0.1 MPa, and a time: 3 minutes. In the case of performing the etching with high-temperature H$_2$ gas in Si excess atmosphere, SiH4 gas was added at a flow rate: 0.05 sccm. The thermal treatment in N$_2$ gas atmosphere was performed under conditions of a N$_2$ flow rate: 500 sccm, a temperature: 1450° C., a pressure: 1 atmospheric pressure, and a time: 1 minute.

As shown in FIG. 15, in a case where the etching with high-temperature H$_2$ gas was performed in Si excess atmosphere (the graph J), the interface defect density was significantly reduced to $3\times10^{10}$ cm$^{-2}$ eV$^{-1}$ or less. On the other hand, in a case where the etching with high-temperature H$_2$ gas was not performed in Si excess atmosphere, the interface defect density was not sufficiently reduced even by SiO$_2$ film deposition and the high-temperature N$_2$ treatment subsequently performed under optimal conditions, and a high-quality interface was not obtained. This may be because the extremely-thin Si films are not formed on the SiC substrate surface and the surface of the SiC substrate is oxidized at an initial stage of depositing the SiO$_2$ film.

As a result of analysis of the types of defects on the SiC substrate side by the DLTS method for a sample for which the etching with high-temperature H$_2$ gas was performed in Si excess atmosphere, no defects (no defects indicated by the arrows N1 to N3, P1 shown in FIGS. 3 and 4) caused due to oxidation of the SiC crystal were observed. On the other hand, for a sample for which the etching with high-temperature H$_2$ gas was not performed in Si excess atmosphere, the defects caused due to oxidation of the SiC crystal were observed on the SiC substrate side. This means that the surface of the SiC substrate 1 is oxidized even after the SiO$_2$ film 4 has been deposited on the SiC substrate 1 under the conditions where the SiC substrate 1 is assumed not to be oxidized.

As described above, the method for manufacturing the SiC semiconductor device in the present embodiment includes a step of etching the surface of the SiC substrate 1 with H$_2$ gas at a temperature of 1200° C. or more in Si excess atmosphere, a step of forming the SiO$_2$ film 4 on the SiC substrate 1 by the CVD method, and a step of thermally treating the SiC substrate 1 formed with the SiO$_2$ film 4 in N$_2$ gas atmosphere at a temperature of 1350° C. or more. With this configuration, the defect density at the interface between the SiO$_2$ film 4 and the SiC substrate 1 can be significantly reduced, and the SiO$_2$ film 4 can be obtained with a high quality and stable properties.

(SiC Semiconductor Device)

The SiC semiconductor device (the SiC MOSFET) can be formed using, as a gate insulating film, the SiO$_2$ film formed by the manufacturing method of the present embodiment. In such a SiC semiconductor device, the nitrogen atoms are present at a density of $2\times10^{19}$ cm$^{-3}$ or more at the interface between the SiC substrate and the SiO$_2$ film and in the SiO$_2$ film.

The interface defect density at the interface between the SiC substrate and the SiO$_2$ film in the vicinity of the energy lower than the conduction band edge by 0.3 eV is $3\times10^{10}$ cm$^{-2}$ eV$^{-1}$ or less.

Of the point defects on the SiC substrate side, the density at the energy lower than the conduction band edge by 1.0 eV and the density at the energy higher than the valance band edge by 0.7 eV are $5\times10^{11}$ cm$^{-3}$ or less.

The present invention has been described above with reference to the preferred embodiments, but such description is not limited and various modifications may be made thereto, needless to say. For example, in the above-described embodiments, the SiC epitaxial layer is formed on the surface of the SiC substrate, and the SiO$_2$ film is formed on the SiC epitaxial layer. However, the SiO$_2$ film may be directly formed on the SiC substrate.

In the above-described embodiments, the SiC substrate from which the oxide film has been removed after sacrificial oxidation of the surface is used, but the manufacturing method of the present invention is also applicable to a SiC substrate for which sacrificial oxidation is not performed.

DESCRIPTION OF REFERENCE CHARACTERS

1 SiC Substrate
2 Si Thin Film
3, 4 SiO$_2$ Film

The invention claimed is:

1. A SiC semiconductor device manufacturing method comprising:
   a step (A) of etching a surface of a SiC substrate with H$_2$ gas at a temperature of 1200° C. or more;
   a step (B) of forming a SiO$_2$ film on the SiC substrate under a condition where the SiC substrate is not oxidized; and
   a step (C) of thermally treating the SiC substrate formed with the SiO$_2$ film in N$_2$ gas atmosphere at a temperature of 350° C. or more.

2. The SiC semiconductor device manufacturing method of claim 1, wherein
   the step (B) includes
      a step (B1) of depositing a Si thin film on the SiC substrate by a CVD method, and a step (B2) of thermally oxidizing the Si thin film at a temperature at which the SiC substrate is not oxidized to form the $SiO_2$ film.

3. The SiC semiconductor device manufacturing method of claim 2, wherein
the step (B2) is executed within a temperature range of 750 to 850° C.

4. The SiC semiconductor device manufacturing method of claim 1, wherein
the step (A) is executed in Si excess atmosphere, and
the step (B) includes a step (B3) of forming the $SiO_2$ film on the SiC substrate by a CVD method.

5. The SiC semiconductor device manufacturing method of claim 4, wherein
in the step (A), a one- to three-monolayer-thick Si film is formed on the surface of the SiC substrate.

6. The SiC semiconductor device manufacturing method of claim 1, further comprising:
before the step (A), a step of etching away an oxide film on the surface of the SiC substrate after sacrificial oxidation of the SiC substrate.

7. The SiC semiconductor device manufacturing method of claim 1, wherein
after the thermal treatment of the step (C), a nitrogen atom is present at a density of $2\times10^{19}$ $cm^{-3}$ or more at an interface between the SiC substrate and the $SiO_2$ film and in the $SiO_2$ film.

8. The SiC semiconductor device manufacturing method of claim 1, wherein
after the thermal treatment of the step (C), an interface defect density at an interface between the SiC substrate and the $SiO_2$ film in a vicinity of an energy lower than a conduction band edge by 0.3 eV is $3\times10^{10}$ $cm^{-2}$ $eV^{-1}$ or less.

9. The SiC semiconductor device manufacturing method of claim 1, wherein
of a point defect on a SiC substrate side after the thermal treatment of the step (C), a density at an energy lower than a conduction band edge by 1.0 eV and a density at an energy higher than a valance band edge by 0.7 eV are $5\times10^{11}$ $cm^{-3}$ or less.

10. The SiC semiconductor device manufacturing method of claim 1, wherein
the SiC substrate includes a SiC substrate formed with a SiC epitaxial layer on a surface thereof.

* * * * *